US011960274B2

(12) United States Patent
Herzog et al.

(10) Patent No.: US 11,960,274 B2
(45) Date of Patent: Apr. 16, 2024

(54) METHOD FOR MONITORING AN ELECTRICAL SWITCHING ARRANGEMENT

(71) Applicant: B&R INDUSTRIAL AUTOMATION GMBH, Eggelsberg (AT)

(72) Inventors: Marc Herzog, Eggelsberg (AT); Matthias Kleineberg, Eggelsberg (AT)

(73) Assignee: B&R INDUSTRIAL AUTOMATION GMBH, Eggelsberg (AT)

( * ) Notice: Subject to any disclaimer, the term of this patent is extended or adjusted under 35 U.S.C. 154(b) by 51 days.

(21) Appl. No.: 17/959,572

(22) Filed: Oct. 4, 2022

(65) Prior Publication Data

US 2023/0107557 A1 Apr. 6, 2023

(30) Foreign Application Priority Data

Oct. 5, 2021 (AT) .............................. A 50795/2021

(51) Int. Cl.
*G05B 9/03* (2006.01)
*G01R 31/327* (2006.01)
(Continued)

(52) U.S. Cl.
CPC ............. *G05B 9/03* (2013.01); *G01R 31/327* (2013.01); *G01R 31/3275* (2013.01);
(Continued)

(58) Field of Classification Search
CPC .. G01R 31/56; G01R 31/327; G01R 31/3275; G05B 9/02; G05B 9/03; H01H 47/002;
(Continued)

(56) References Cited

U.S. PATENT DOCUMENTS

| 8,692,420 B2 | 4/2014 | Frevert |
| 9,343,896 B2 | 5/2016 | Laturner |

(Continued)

FOREIGN PATENT DOCUMENTS

| EP | 2202592 | 6/2010 |
| EP | 2733718 | 5/2014 |
| WO | 2011/061345 | 5/2011 |

OTHER PUBLICATIONS

Austria Search Report conducted in counterpart Austria Appln. No. A 50795/2021 (dated Sep. 26, 2022).

*Primary Examiner* — Ryan Johnson
(74) *Attorney, Agent, or Firm* — GREENBLUM & BERNSTEIN, P.L.C.

(57) ABSTRACT

In order to specify a method, which is improved in comparison to the prior art, for monitoring an electrical switching arrangement having at least two channels, which each electrically conductively connect an electrical source supplying the respective channel, forming an electrical supply quantity, to an output of the respective channel, the switching arrangement is fed not only an external safety signal, from which an internal safety signal is respectively generated for the at least two channels in order to therewith control a voltage interrupter connected in series in the respective channel, but also a pulsed diagnostic signal, which is superimposed on the internal safety signals in order to alternately open and close again the voltage interrupters connected in the respective channels and to thus respectively alternately interrupt the supply quantities appearing in the respective channels.

10 Claims, 5 Drawing Sheets

(51) Int. Cl.
*G01R 31/56* (2020.01)
*H01H 47/00* (2006.01)
*H02P 29/024* (2016.01)

(52) U.S. Cl.
CPC ........... *G01R 31/56* (2020.01); *H01H 47/005* (2013.01); *H02P 29/024* (2013.01)

(58) Field of Classification Search
CPC ...... H01H 47/005; H02H 3/00; H02H 7/0844; H02P 29/024; H03K 19/007
See application file for complete search history.

(56) References Cited

U.S. PATENT DOCUMENTS

| | | | |
|---|---|---|---|
| 11,293,997 B2 * | 4/2022 | Kishibe | ................... G01R 31/56 |
| 11,735,904 B2 * | 8/2023 | Kishida | ................ H02H 7/0844 |
| | | | 361/23 |
| 2020/0403552 A1 * | 12/2020 | Chang | .................... H02M 7/00 |

* cited by examiner

METHOD FOR MONITORING AN ELECTRICAL SWITCHING ARRANGEMENT

CROSS-REFERENCE TO RELATED APPLICATION

This application claims priority under 35 U.S.C. § 119(a) to Austria Application No. A50795/2021 filed Oct. 5, 2021, the disclosure of which is expressly incorporated by reference herein in its entirety.

BACKGROUND

1. Field of the Invention

Embodiments relate to a method for monitoring an electrical switching arrangement having at least two channels which each electrically conductively connect an electrical source supplying the respective channel, forming an electrical supply quantity, to an output of the respective channel. An external safety signal is fed to the switching arrangement, from which external safety signal an internal safety signal is respectively generated for the at least two channels in order to therewith control a voltage interrupter connected in series in the respective channel.

2. Discussion of Background Information

The steady increase in the complexity of modern technical systems, be it in the field of transport logistics, industrial automation, or even passenger transport, leads to a continuously growing number of questions in the field of functional safety. Functional safety, as a functional component of safety concepts of technical systems, is hereby aimed at protecting humans and/or the environment against malfunctions of a technical system. In a safety concept, objects to be protected and/or protective goals to be pursued are thereby typically first defined; building thereupon possible damage scenarios, malfunctions, and/or hazards are analyzed; their probabilities of occurrence are assessed in a further step; and finally measures and handling workflows—what are known as "safety functions"—are planned that are executed in the event of an occurrence of a damage scenario, a malfunction, or a hazard, with the goal of damage control and/or containment.

For technical systems in which electrical drives or electric drive elements or electrical drive systems are used to achieve technical tasks, a multitude of safety functions are defined in the EN IEC 61800-5-2:2007 standard. According to this standard, the STO ("Safe Torque Off") safety function for the incidence of a hazardous situation describes an immediate interruption of the power supply of the drives present in the system to be protected, wherein the drives are shut down in an uncontrolled manner. After a deactivation according to STO, a drive can no longer generate any torque, and accordingly also can no longer generate braking torque. Within the scope of STO, any necessary braking is typically performed using separate measures or means, for example using mechanical brakes, so that no unwanted overrun or an exceeding of predetermined end positions, for example by a drive axle, takes place. Typical use cases of the STO safety function include switching off an electrical converter or performing an emergency stop triggered by a main switch with emergency stop function.

By contrast, the SS1 ("Safe Stop 1") safety function describes a controlled transition of a drive to the standstill, and only a subsequent activation of STO. Another important safety function is SS2 ("Safe Stop 2"), in which the drives to be monitored are set to a standstill in a controlled manner, but subsequently remain therein while the power supply is maintained. The standstill is hereby monitored.

In addition to the cited safety functions STO, SS1, and SS2, EN IEC 61800-5-2:2007 further describes the functions SOS ("Safe Operating Stop"), SLS ("Safely Limited Speed"), SSM ("Safe Speed Monitor"), SSR ("Safe Speed Range"), SLP ("Safe Limited Position"), SP ("Safe Position"), SD1 ("Safe Direction"), and SBC/SBT ("Safe Brake Control, Safe Brake Test").

To classify the cited safety functions, what are known as stop categories have been defined, of which Stop Categoty 0 describes an immediate disconnection of the power supply to a drive, and accordingly includes the aforementioned STO. By contrast, Stop Category 1 stands for a controlled shutdown, wherein a given drive is first put into a safe state and only then is its power supply disconnected. The SS1 safety function, among other things, falls into stop category 1. Also to be cited is the Stop Category 2, which includes safety functions in which drives or machines are only put into a safe state but the power supply is not disconnected. The SS2 safety function is an example of this.

Notwithstanding the specifically selected safety function, the detection of damage scenarios, of hazards, and of malfunctions in general, after the occurrence of which a predetermined safety function is to be started and executed, is essential to the implementation of a safety concept or a safety function defined therein. For such a detection, suitable safety sensors and/or suitable safety switches are typically used, such as light barriers and/or emergency stop switches and/or safety light grids, for example. In this context, safety sensors are also referred to as safe output elements. Safety sensors preferably communicate, using what are known as safety signals, with what are known as safe switching arrangements, for example in the form of a control unit of a technical system to be monitored, wherein such safe switching arrangements are typically capable of triggering one of the aforementioned safety functions and consequently ensuring their implementation.

If a hazardous situation is detected by a safety sensor, the safety sensor communicates this to a safe switching arrangement, typically using a safety signal, for example via a level change of the safety signal, whereupon the control unit may trigger one of the aforementioned safety functions. Safe switching arrangements which, like a control unit, may receive safety signals are especially also referred to in this context as safe receiving elements. By contrast, safety signals emitted by a safety sensor are often named according to the safety function that is selected and to be triggered; for example, in the instance of STO, the designation "STO signals" is typical. In the course of the following statements, the general term "safety component" is also used to refer all-inclusively to the aforementioned safety-related components other than a safe receiving element, such as safety sensors, circuit breakers, or cables for the connection thereof.

In addition to the mere detection of damage scenarios, hazards, and malfunctions in general, in the implementation of safety functions, attention is likewise to be given to monitoring the safety sensors that are themselves used, their signal lines—for example, to a control unit itself—and overall the safety components that are themselves used. Thus, it is in many cases of significant importance to be able to preclude with certainty that impairments in the transmission of a detection of a hazardous situation cannot occur due to a cable break or other defect of a safety component.

Essentially, two approaches have proven appropriate for this purpose. In a first approach, a redundant execution of safety components is made in this regard. However, this approach is usually associated with increased outlay in terms of material and costs, and is therefore disadvantageous in many instances. By contrast, a second approach relies on the monitoring/diagnosis/testing of safety components performed continuously during operation of a technical system to be monitored. The idea is hereby to detect possible faults in the present safety components themselves as immediately as possible and, in the event of such a detection, to react suitably, for example by in turn triggering a safety function.

An important method for implementing the second approach is based on the use of what are known as diagnostic signals, for example in the form of OSSD test pulses ("Output Signal Switching Device" test pulses). In typical instances, diagnostic signals, such as in particular in the form of OSSD test pulses, represent higher-frequency signals as compared to the cited safety signals. Diagnostic signals are repeatedly superimposed on existing safety signals in order to bring about pulsed level changes in accordance with their frequency in the safety signals. A prerequisite for the use of diagnostic signals, in particular in the form of OSSD test pulses, is that their superposition on a safety signal does not adversely affect the safety functions linked thereto. If this requirement is present, diagnostic signals or safety signals superimposed with diagnostic signals are typically introduced as input diagnostic signals into a safety component to be tested, such as a cable for connecting a safety sensor to a control unit, via an input of the safety components to be tested.

In a further step, at an output of the safety component to be tested that is electrically connected to the input, a measurement is performed of the output diagnostic signal arriving there. It is thereby monitored whether the input diagnostic signal has been transmitted in an expected form to the output. In the typical instances, a sufficient agreement of such input and output diagnostic signals allows the conclusion of the functional integrity of the tested safety component. However, if the input diagnostic signal and the output diagnostic signal deviate from one another, a defect can be inferred and a safety function can accordingly be triggered. Diagnostic signals are preferably generated by safety sensors themselves, thus by safe output elements.

Diagnostic signals in general, and OSSD test pulses generated by a safe output element especially, may be used for detecting short circuits and/or cross-faults in cables, for example. Of course, faults can also be detected directly at a safe output element or at the input of a receiving element. Corresponding to their pulsed form, OSSD test pulses include high levels (OSSD high pulses) and low levels (OSSD low pulses). OSSD low pulses are thereby repeatedly filtered away at the input of a safe receiving element; on the one hand, since their primary purpose is the testing of external safety components other than the receiving element, on the other hand, in order to not interfere with safe receiving elements due to high-frequency OSSD test pulses. Typical values for OSSD test pulses are, for example, a pulse duration of ≤1.0 ms and a period duration of ≥500 ms.

In accordance with the above statements and the two presented approaches, in the field of functional safety, to achieve a high safety level or a low probability for dangerous faults, either as many safety components as possible may be executed redundantly, or these are tested or diagnosed continuously during their operation. The quality of such tests or diagnoses is repeatedly described using what is known as the diagnostic coverage ("DC value"). The diagnostic coverage thereby represents the sum of all the detected dangerous failures in relation to the total number of all dangerous failures. If fewer circuit parts are redundantly executed, it may be necessary to monitor/diagnose a greater number of safety components in order to meet the same safety requirements. According to the IEC 61508/IEC61511 standard, safety requirements are thereby also referred to as a safety requirement level, safety level, or safety integrity level (SIL), for example, where a measure of the assessment of electrical/electronic/programmable electronic (E/E/PE) systems with respect to the reliability of safety functions and components is described using these terms.

Similar embodiments may also be learned from the prior art. EP 2733718 A2 thus describes a method and a circuit for evaluating OSSD signals, coming from a safe output element, in a safe receiving element.

Although an evaluation circuit for OSSD signals is specified in the cited publication, no further considerations are presented as to how a further increase in the diagnostic coverage may be brought about using a given OSSD signal, or in general using a diagnostic signal. In view of increasing demands in the field of functional safety, a steady increase in the diagnostic coverage is, however, an often posed and essential task. In particular, the diagnosis of safe receiving elements themselves is not described in the prior art. Accordingly, in the prior art, no approaches are described that consider inner circuit parts which lie within safe receiving elements, explicitly with the goal of increasing the diagnostic coverage. This circumstance represents an as of yet unclosed gap in the field of functional safety.

SUMMARY

Embodiments specify a method for increasing the diagnostic coverage of safe electrical receiving elements.

Accordingly, an electrical switching arrangement having at least two channels is thereby assumed, which channels each electrically conductively connect an electrical source supplying the respective channel, forming an electrical supply quantity, to an output of the respective channel, wherein an external safety signal is fed to the switching arrangement, from which external safety signal an internal safety signal is respectively generated for the at least two channels in order to therewith control a voltage interrupter connected in series in the respective channel.

According to embodiments, for such a switching arrangement it is provided to superimpose on the internal safety signals a pulsed diagnostic signal, in which a first diagnostic signal level and a second diagnostic signal level alternate, to form two safety signal levels which alternate in the internal safety signals, in order to open the voltage interrupters connected in the respective channels by controlling with the first safety signal level, and to close them by controlling with the second safety signal level, and to thus respectively alternately interrupt the supply quantities appearing in the respective channels.

"Alternately interrupting" the supply quantities appearing in the respective channels is to be understood as bringing about a temporal sequence of at least two supply quantity signal levels in the respective supply quantities appearing in the respective channels. This can mean that as a result of the alternating interruption, the respective supply quantities first assume a first supply quantity signal level, then assume a second, different supply quantity signal level, then again assume the first supply quantity signal level etc. In the event of supply quantities being present as voltages, the first supply quantity signal level may result as equal to a supply voltage supplying the electrical switching arrangement, and the second supply quantity signal level may be equal to a reference potential assigned to the electrical switching arrangement. However, the at least two alternating supply quantity signal levels effected by the alternating interruption may also assume other values. In many instances, it may be advantageous in this context if the respective supply quantities appearing in the respective channels are alternately interrupted synchronously. If the supply quantities appearing in the respective channels are alternately interrupted synchronously, the changes from a first supply quantity signal level to a second supply quantity signal level in the supply quantities of the respective channels are respectively effected at the same points in time.

However, an asynchronous alternating interruption of the supply quantities is also conceivable, wherein the changes from a first supply quantity signal level to a second supply quantity signal level in the respective supply quantities are respectively effected at different points in time. In some instances. a complementary alternating interruption of the supply quantities appearing in the respective channels is also conceivable. In the case of a complementary alternating interruption of the respective supply quantities, a first supply quantity signal level may then always be assigned to a first supply quantity when a second supply quantity has a second supply quantity signal level, and the second supply quantity signal level may always be assigned to the first supply quantity when the second supply quantity has the first supply quantity signal level. A complementary alternating interruption of the supply quantities may likewise be designed synchronously or asynchronously.

Based on this, it is provided according to embodiments to measure the alternately interrupted supply quantities as measurement quantities, and to compare the detected measurement quantities of the alternately interrupted supply quantities to one another in order to determine a deviation between the detected measurement quantities for monitoring the electrical switching arrangement. In a particularly advantageous manner, a diagnostic signal that is generated outside the switching arrangement to be monitored, thus an external diagnostic signal, may be used as a diagnostic signal which is superimposed on the internal safety signals. External diagnostic signals may thus be used for internal monitoring in safe electrical switching arrangements, whereby in particular the achievable diagnostic coverage may be increased.

In the above-described procedure, particular importance is accorded to the measurement of the transmitted supply quantities. Advantageously, a measurement of the transmitted supply quantities is hereby performed in such a way that changes in the supply quantities are reliably reproduced by the detected measurement quantities. A measurement of the transmitted supply quantities may hereby be implemented in an analog manner, but also digitally. If the measurement of the supply quantities takes place digitally, a sampling of the supply quantities to be measured is required. In the case of a digital measurement of the supply quantities, and accordingly a sampling of the supply quantities, in particular the selection of the measurement points in time at which measurement is performed is given importance, since it is to be ensured that changes in the supply quantities may also be reproduced by the measurement quantities recorded at the measurement points in time. In an advantageous manner, for this purpose the alternately interrupted supply quantities can respectively be measured at at least one measurement point in time at which the diagnostic signal has the first signal level. In addition, it is often advantageous to additionally respectively measure the alternately interrupted supply quantities also at at least one measurement point in time at which the diagnostic signal has the second signal level. A further advantageous selection of the measurement points in time may moreover take place in this context in that at least one measurement point in time is chosen which lies within a rising or a falling edge of the diagnostic signal, wherein a transition of the diagnostic signal from the first signal level to the second signal level takes place in a rising edge of the diagnostic signal, and a transition of the diagnostic signal from the second signal level to the first signal level takes place in a falling edge of the diagnostic signal. Changes occurring in the channels may be reliably detected in the described manner.

In the event of an analog measurement of the supply quantities to be measured, no considerations must be made regarding measurement points in time to be selected. Since, in the case of an analog measurement, the measurement does not take place at selected discrete sampling points in time but continuously, the points in time at which changes in the supply quantities occur or are to be expected are also automatically detected in the case of an analog measurement. For this reason, an analog measurement may in many instances also be advantageously used within the scope of the present invention.

If a deviation between the detected measurement quantities is established, from which a malfunction in one of the channels may be inferred, this circumstance may advantageously be suitably reacted to in that the outputs of the at least two channels are de-energized. In order to achieve a de-energized state at the outputs of the channels, the voltage interrupters provided in the channels may advantageously be opened; the output voltages dropping at the outputs of the channels, which may correspond, for example, to driver supply voltages generated by the switching arrangement in the event of supplying a driver circuit, are brought to zero by means of a voltage regulator provided for adjusting the output voltages; or the electrical source for supplying the channels is deactivated. The specific embodiment of a measure in order to de-energize the output of a channel is hereby not decisive; rather, it is important that a finding of a possible malfunction in a channel is suitably integrated into the safety concept of the switching arrangement.

In normal operation, thus if there are no malfunctions in the channels diagnosed according to the invention, it is moreover advantageous in many instances to further reduce, via suitable additional measures, the influence of the diagnostic signal used for the diagnosis according to the invention. For this purpose, at least one filter element may advantageously be arranged in the channels in order to smooth the supply quantities, in particular via a low-pass filtering of the supply quantities effected by means of the at least one filter element.

Via a method according embodiments, it is possible to make components accessible to a diagnosis and thus monitoring for which the method described within. the scope of from the prior art was not possible. It is precisely this difference that represents an important improvement compared to methods known from the prior art. The principle, according to the invention, of the use of external diagnostic signals also for internal testing of safe receiving elements may thereby be generally applied in the field of functional safety.

BRIEF DESCRIPTION OF THE DRAWINGS

In the following, the present invention is explained in greater detail with reference to FIGS. 1 to 5, which, by way of example, show schematic and non-limiting advantageous embodiments of the invention. In the drawings.

DETAILED DESCRIPTION

Figure 1:
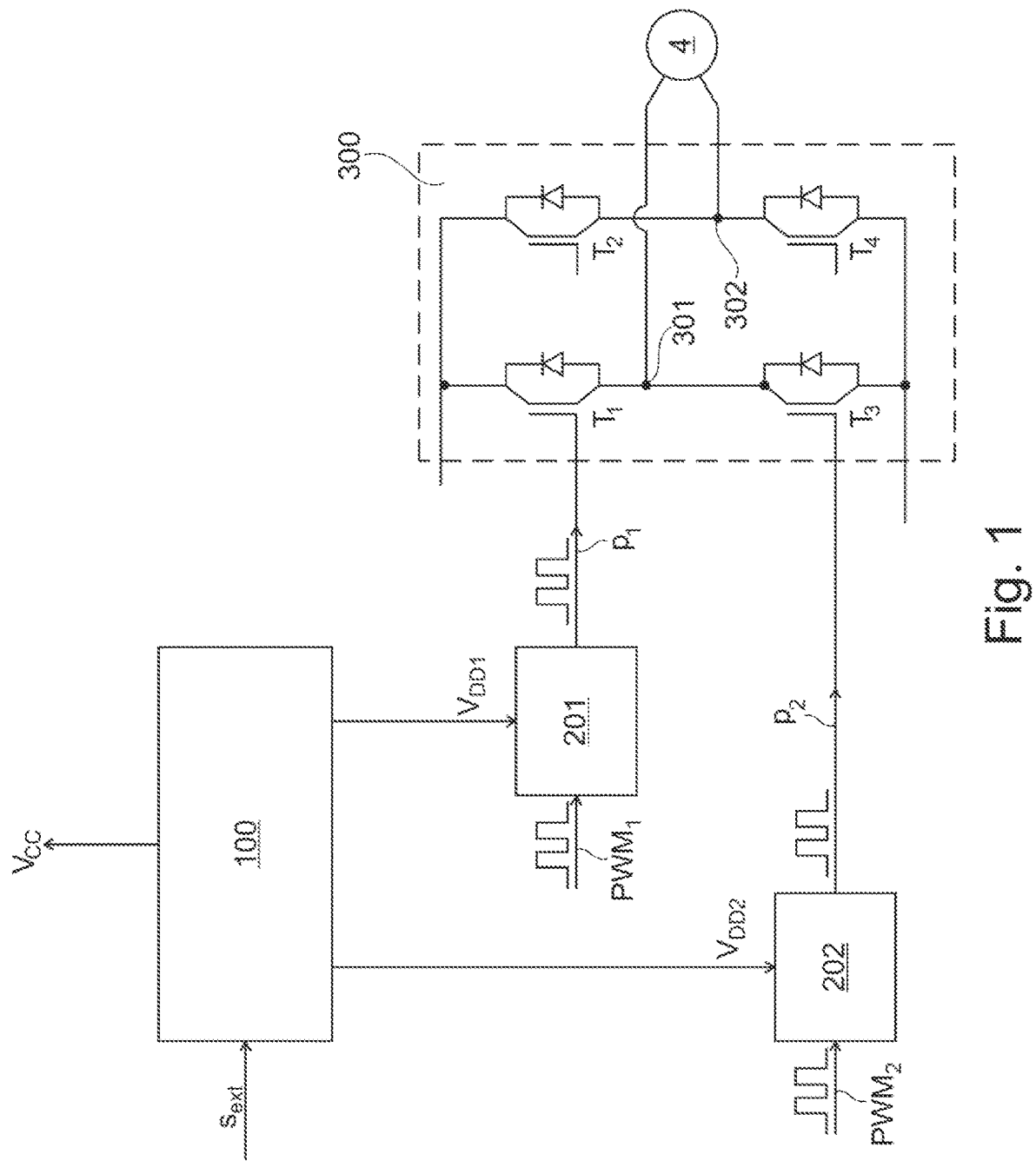
FIG. 1 shows a safe control of an electrical load in the form of a block diagram.

FIG. 1 shows a safe control of an electrical load 4, as is customary when applying the STO safety function. In the circuit shown in FIG. 1, the driver modules 201 and 202 are used to convert the control signals $PWM_1$ and $PWM_2$, present as PWM signals, into the switching signals $p_1$ and $p_2$, which in turn control the semiconductor switches $T_1$ to $T_4$ and open and close these according to the control signals $PWM_1$ and $PWM_2$. The driver modules 201 and 202 may thereby be implemented in a known manner as discrete or integrated circuits, wherein the designation "gate driver" is also common instead of the term "driver module". Optocouplers for galvanic isolation are often provided in driver modules. However, a galvanic isolation does not necessarily need to take place via optocouplers; inductive, capacitive, and other isolators are also possible for this purpose. In instances in which galvanic isolation is not required, it may also be dispensed with entirely.

In principle, for each semiconductor switch $T_1$ to $T_4$, a separate driver module is used which is respectively supplied by a driver supply voltage $V_{DD1}$ or $V_{DD2}$. For reasons of clarity, FIG. 1 shows only the driver modules 201 and 202 in this regard. In the shown instance, the driver supply voltages $V_{DD1}$ and $V_{DD2}$ are provided by the switching arrangement 100, for which purpose the switching arrangement 100 is in turn supplied from a source with the supply voltage $V_{CC}$. The method according to the invention can advantageously be applied in particular in switching arrangements such as the switching arrangement 100 shown in FIG. 1. In order to allow an application of the method according to the invention in the shown switching arrangement 100, in the present case the external safety signal $s_{ext}$ is routed into the switching arrangement 100.

The STO safety function ("STO function") is based on the fact that, although a pulse signal PWM, for example output by a controller, is forwarded to a driver module 201, 202, the power supply of the driver modules 201, 202, for example by the supply voltages $V_{DD1}$, $V_{DD2}$ is interrupted if the STO function is activated, whereby the PWM signal cannot be relayed. In the shown instance, such an interruption may take place via the switching arrangement 100. A wide variety of signal modulations may be applied as pulse signals $PWM_1$, $PWM_2$. The pulse width/pulse duration modulation, pulse length modulation, and pulse frequency modulation are mentioned only by way of example and not so as to be further limiting.

As is furthermore apparent in FIG. 1, in order to control the electrical load 4, an inverter 300 with a half-bridge per phase is used in a known manner, here for example with a first half-bridge, consisting of the semiconductor switches $T_1$ and $T_3$, and a second half-bridge, consisting of the semiconductor switches $T_2$ and $T_4$, for an exemplary, two-phase electrical load 4. In the shown instance, the electrical load 4 is connected to a first node 301 and a second node 302. The nodes 301 and 302 are thereby arranged in such a way that the first node 301 is situated between the two semiconductor switches $T_1$ and $T_3$; the second node 302 is situated between the two semiconductor switches $T_2$ and $T_4$. As described above, each semiconductor switch $T_1$ to $T_4$ is thereby controlled by a separate driver module. Since the basic functionality of an inverter 300 is sufficiently known, it will not be discussed in more detail here. Of course, the electrical load 4 and the inverter 300 may also be implemented with a different phase number.

Figure 2:
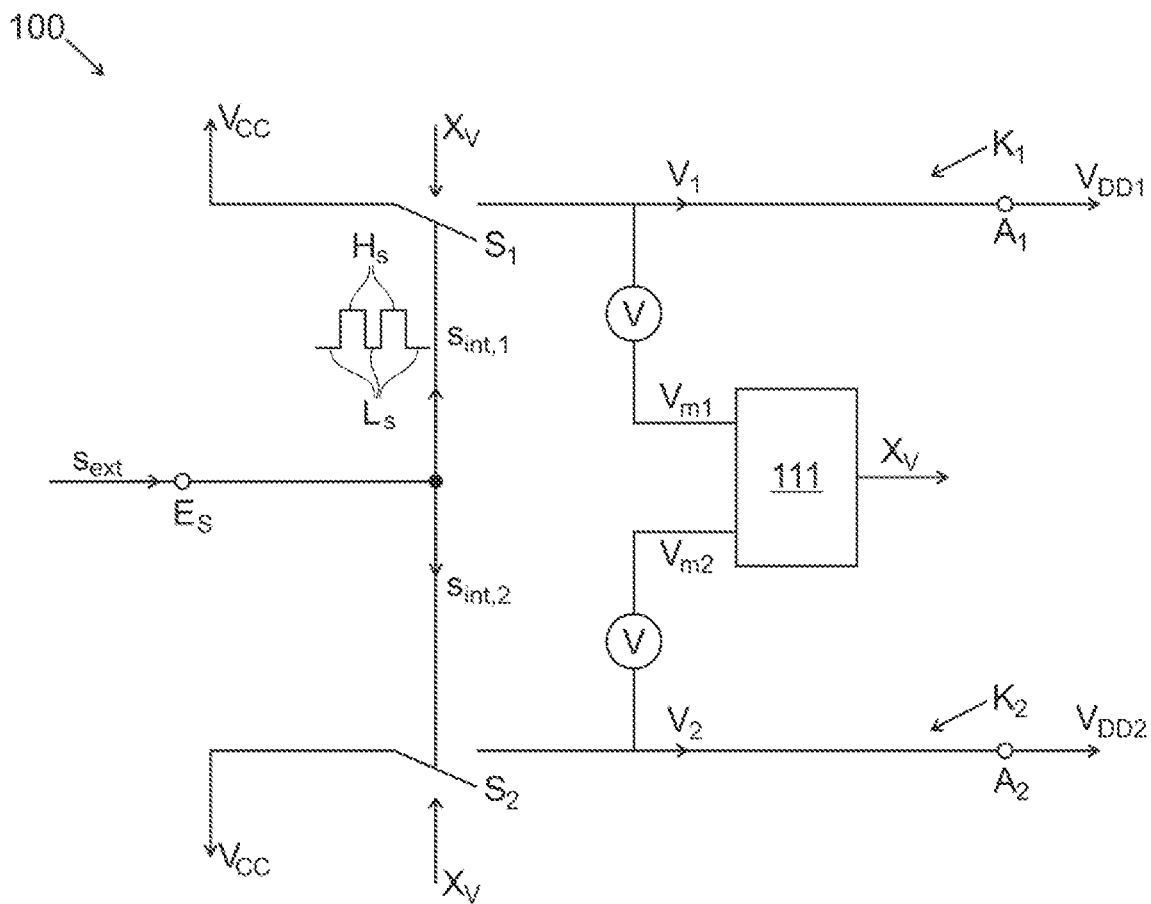
FIG. 2 shows a schematic view of a switching arrangement according to the invention, reduced to the components necessary for the method according to the invention.

FIG. 2 shows a schematic representation of the switching arrangement 100 shown in FIG. 1, reduced to the components required for an application of the method according to the invention. In principle, the shown switching arrangement 100 may itself hereby represent a safe input element or, however, may be a component of a safe input element, in addition to further components of the safe input element. Further components may thereby be provided, for example, by interfaces to further safe and non-safe devices, or also correspond to input and/or output elements for communication with an operator. A safe input element can be provided, for example, by a control unit of a technical system to be monitored, such as by a PLC (programmable logic controller), a safety PLC, a converter controller, or a compact converter with integrated control etc. For an application of the method according to the invention in a switching arrangement 100, it is essential that at least two channels $K_1$ and $K_2$ are provided in the switching arrangement 100, which are respectively supplied by an electrical source with a supply voltage $V_{CC}$; the channels $K_1$ and $K_2$ each transmit an electrical supply quantity $V_1$, $V_2$ from the electrical source to an output $A_1$, $A_2$ of the respective channel, for example in order to provide a driver supply voltage such as $V_{DD1}$ or $V_{DD2}$; and the switching arrangement 100 is designed to receive an external safety signal $s_{ext}$ which, in particular, may transport an STO signal. The supply quantities $V_1$, $V_2$ thereby appearing in the channels may hereby be present due to electrical currents or electrical voltages, for example.

In an advantageous embodiment of the present invention, an external safety signal $s_{ext}$ may also contribute to the implementation of other safety functions, and thus transport, for example, an SS1 signal, or an SS2 signal, or an SOS signal, or an SLS signal, or an SSM signal, or an SSR signal, or an SLP signal, or an SP signal, or an SDI signal, or an SBC/SBT signal, or a further signal of functional safety. The cited safety signals, and thereby in particular STO signals, are thereby preferably designed so that a high signal level ("H level", "High level", e.g., 24 V or 10 V or 5 V) represents a fault-free situation; by contrast, a low signal level ("L level", "Low level", e.g., 0 V) represents a fault. In particular, failures of the supply of a safe output element or cable breaks can also be detected via this selection.

In the situation shown in FIG. 2, the external safety signal $s_{ext}$ is received by the switching arrangement 100 via the input interface $E_s$. From the external safety signal $s_{ext}$, the internal safety signals $s_{int,1}$ and $s_{int,2}$ are consequently generated, wherein, in the present context, what is to be understood by the generation of internal safety signals $s_{int,1}$ and $s_{int,2}$ is in general the generation/provision of internal safety signals $s_{int,1}$, $s_{int,2}$ depending on the external safety signal $s_{ext}$. This includes the direct linking of the external safety signal $s_{ext}$ with signal lines for the internal safety signals $s_{int,1}$ and $s_{int,2}$ as shown in FIG. 2, hut also the generation of internal safety signals $s_{int,1}$ and $s_{int,2}$ based on a galvanic decoupling between internal and external safety signals. A galvanic decoupling may hereby be achieved, for example, using optocouplers. If, as described above, the external safety signal $s_{ext}$ transports an STO signal, upon its generation this STO signal is also transmitted on the internal safety signals $s_{int,1}$ and $s_{int,2}$, and is accordingly also part of the internal safety signals $s_{int,1}$ and $s_{int,2}$. This means, in particular, that level changes in an external safety signal $s_{ext}$ are mapped to level changes in the internal safety signals $s_{int,1}$ and $s_{int,2}$.

In the further course of events, the internal safety signals $s_{int,1}$ and $s_{int,2}$ are conducted to the voltage interrupters $S_1$, $S_2$ and are there used to control the voltage interrupters $S_1$, $S_2$. The voltage interrupters $S_1$, $S_2$ thereby respectively represent a central component of the channels $K_1$, $K_2$. The voltage interrupters $S_1$, $S_2$ provided in the channels $K_1$, $K_2$ are preferably implemented as semiconductor switches, for example in the form of longitudinal MOSFETs or in the form of IGBTs or other semiconductor switches. The primary purpose of the voltage interrupters $S_1$, $S_2$ is to produce in the channels $K_1$, $K_2$ a conductive electrical connection between the electrical source providing the supply voltage $V_{CC}$ and the outputs $A_1$, $A_2$, and to be able to disconnect this connection again as needed, in particular if a safety function triggers. For this purpose, the voltage interrupters $S_1$, $S_2$ are controlled by internal safety signals $s_{int,1}$ and $s_{int,2}$ and are correspondingly opened or closed. For this purpose, a first, low safety signal level $L_s$ as well as a second, high safety signal level $H_s$ are typically provided in the internal safety signal $s_{int,1}$, $s_{int,2}$. If, in the situation shown in FIG. 2, the high, second safety signal level $H_S$ is present at the voltage interrupters $S_1$, $S_2$, these are closed; by contrast, if the low safety signal level $L_S$ is present at the voltage interrupters $S_1$, $S_2$, these are opened. As mentioned, these safety signal levels $L_s$, $H_s$ result depending on the signal level of the external safety signal seat from which the internal safety signals $s_{int,1}$, $s_{int,2}$ are generated. If, for example, a low level in external safety signal $S_{ext}$ signals a fault or a request for a safety function by a user or operator, this low level is mapped to a low safety signal level $L_S$ in the safety signals $s_{int,1}$, $s_{int,2}$ which consequently opens the voltage interrupters $S_1$, $S_2$. In a preferred embodiment, the levels of an external safety signal $s_{ext}$ and those of an internal safety signal $s_{int}$ have the same level; however, this is not absolutely necessary for the application of the present invention.

According to the invention, for the shown switching arrangement 100 it is, however, not only provided to use the internal safety signals $s_{int,1}$, $s_{int,2}$ to implement a safety function, such as STO, but rather to likewise use these signals for diagnostic and monitoring purposes. For this purpose, a higher-frequency diagnostic signal d is superimposed on the internal safety signals $s_{int,1}$, $s_{int,2}$. This procedure stands in clear contrast to methods known from the prior art, where diagnostic signals d, such as, for example, the cited external OSSD signals, are typically prevented from arriving into the interior of a safe switching arrangement 100. If diagnostic signals d are already part of an arriving safety signal $s_{ext}$, for example because a diagnostic signal d has already been superimposed on an external safety signal $s_{ext}$ outside a switching arrangement 100, in the prior art these are filtered from the incoming safety signal $s_{ext}$, if possible at the input of a safe switching arrangement 100. In the prior art, the often higher-frequency diagnostic signals d are in this way prevented from arriving into the interior of a safe switching arrangement 100, whereupon it is attempted to prevent unwanted cross-effects and negative influences on the functionality of the switching arrangement 100 by higher-frequency diagnostic signals d. It is all the more surprising that, due to the deliberate use of higher-frequency diagnostic signals d in the interior of a safe switching arrangement 100, the diagnostic coverage of such a switching arrangement 100 may conversely be directly increased, and thus the robustness, the reliability, and consequently also the functionality of a switching arrangement 100 may be improved as a whole.

In order to implement the described use of internal safety signals $s_{int,1}$, $s_{int,2}$ for diagnostic and monitoring purposes, it is provided according to the invention to provide a pulsed signal component in the safety signals $s_{int,1}$, $s_{int,2}$ by the superposition of a pulsed diagnostic signal d. Such a diagnostic signal d is preferably provided here by an (external) OSSD signal, which is preferably provided by an (external) safe output element, such as a safety sensor, or a safety light grid or a light barrier. Within the scope of the present invention, a diagnostic signal d is assumed, in which a first diagnostic signal level $L_d$ and a second diagnostic signal level $H_d$ alternate. This alternation between the first diagnostic signal level $L_d$ and the second diagnostic signal level $H_d$ may also be understood as a sequence of OSSD test pulses. As mentioned, typical values for OSSD test pulses are, for example, a pulse duration of ≤1.0 ms and a period duration ≥500 ms. It also applies at this point that the diagnostic signal levels $H_d$, $L_d$, the safety signal level $H_s$, $L_s$ and the levels of an external safety signal, for example STO level, may be the same. However, this is not a requirement for an application of the present invention.

Figure 2A:
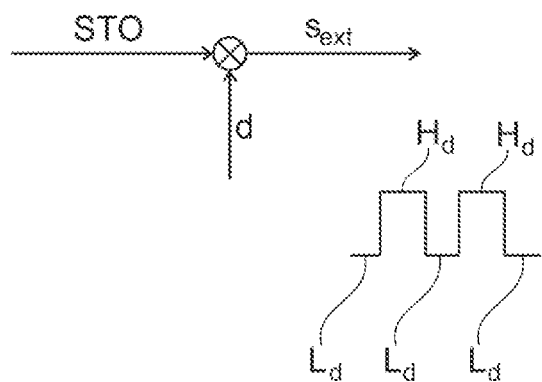
FIG. 2A shows a possibility for superimposing a safety signal with an external diagnostic signal.

In an advantageous manner, the superposition of a pulsed diagnostic signal d onto an internal safety signal $s_{int,1}$, $s_{int,2}$ can take place by an external pulsed diagnostic signal d already being transported with the external safety signal seat from which the internal safety signals $s_{int,1}$, $s_{int,2}$ are generated. Such situations occur when, for example, a pulsed diagnostic signal d is superimposed onto an STO signal, which can already take place in a safe output element. Such a superposition can be achieved in an advantageous manner by multiplying an STO signal with a diagnostic signal d, wherein the term "superposition" is not to be understood as limiting. Depending on the specific application, it may likewise be expedient to add the signals, to convolute them, or to link the signals to be superimposed in another way. The implementation of this step on the basis of a multiplication is shown schematically in FIG. 2A. The resulting pulsed form of the internal safety signals $s_{int,1}$ and $s_{int,2}$ is qualitatively indicated in FIG. 2 on the basis of the pulse trains arranged next to the signal arrows. In the context of the present invention, it is however likewise conceivable to guide a diagnostic signal via a separate signal input into a switching arrangement 100 and to perform the superposition of the diagnostic signal d onto the internal safety signals $s_{int,1}$, $s_{int,2}$ only in the switching arrangement 100, for example on the basis of a multiplication of an external signal set with the diagnostic signal d. In both variants, the first diagnostic signal level $L_d$ and the second diagnostic signal level $H_d$, which alternate in the diagnostic signal d, lead to the formation of two safety signal levels $H_s$, $L_s$ which alternate in the internal safety signals $s_{int,1}$, $s_{int,2}$.

The internal safety signals $s_{int,1}$, $s_{int,2}$ in which the first diagnostic signal level $L_d$ and the second diagnostic signal level $H_d$ alternate according to the above statements, are now used according to the invention in order to control the voltage interrupters $S_1$, $S_2$ provided in the channels $K_1$, $K_2$ in a manner corresponding to the alternating first diagnostic signal levels $L_d$ and second diagnostic signal levels $H_d$ and to thus open the voltage interrupters $S_1$, $S_2$ by controlling with the first safety signal level $L_s$ and to close them again by controlling with the second safety signal level $H_s$. If the voltage interrupters $S_1$, $S_2$ are closed, an electrical conductive connection is produced in the channels $K_1$, $K_2$ between the connected supply voltage $V_{CC}$ and the outputs $A_1$, $A_2$ of the channels $K_1$, $K_2$ where the driver supply voltages $V_{DD1}$ and $V_{DD2}$ are output. If the voltage interrupters $S_1$, $S_2$ are open, this connection is disconnected, which has a direct effect on the supply quantities $V_1$, $V_2$ appearing/resulting in the channels $K_1$, $K_2$. Alternately interrupted supply quantities $V_1$, $V_2$ are produced.

As already stated, "alternately interrupting" the supply quantities $V_1$, $V_2$ appearing in the respective channels $K_1$, $K_2$ is to be understood to mean bringing about a temporal sequence of at least two supply quantity signal levels in the respective supply quantities $V_1$, $V_2$ appearing in the respective channels. This can mean that as a result of the alternating interruption by the switching of the voltage interrupters $S_1$, $S_2$, the respective supply quantities $V_1$, $V_2$ first assume a first supply quantity signal level, then assume a second, different supply quantity signal level, then again assume the first supply quantity signal level, etc. Here, the first supply quantity signal level may correspond to the supply voltage $V_{CC}$ supplying the electrical switching arrangement 100 and the second. supply quantity signal level may be equal to the reference potential assigned to the electrical switching arrangement 100. As likewise already stated at the outset, the at least two alternating supply quantity signal levels brought about by the alternating interruption may however also be selected differently.

In order to implement the monitoring and/or diagnosis of the switching arrangement 100 according to the invention, the supply quantities $V_1$, $V_2$ present in the channels $K_1$ and $K_2$ are measured in a further step, which is shown in the situation shown in FIG. 2 on the basis of the two switching symbols for a voltage measuring device. The measurement quantities $V_{m1}$ and $V_{m2}$ result from this measurement. As sufficiently known from metrology, such a measurement can take place in the form of discrete sampling, for example with a sampling rate of more than 100 Hz, or a sampling rate of more than 1 kHz, or else with a sampling rate of more than 10 kHz. However, the measurements mentioned can also take place in an analog manner.

When performing the method according to the invention on the basis of a discrete measurement and thus discrete sampling, a suitable selection of measurement points in time $T_m$ at which the measurement of the supply quantities $V_1$, $V_2$ is performed is important. When selecting measurement points in time $T_m$, it is necessary to ensure that the changes in the supply quantities $V_1$, $V_2$ that are brought about by the now pulsed internal safety signals $s_{int,1}$, $s_{int,2}$ are also in fact detected by the measurement and are accordingly represented in the detected measurement quantities $V_{m1}$, $V_{m2}$. This can be achieved by respectively measuring the pulse-wise interrupted supply quantities $V_1$, $V_2$ at at least one measurement point in time $T_m$ at which the diagnostic signal d has the first diagnostic signal level $L_d$. However, it may be advantageous to respectively measure the pulse-wise interrupted supply quantities $V_1$, $V_2$ at at least one further measurement point in time $T_m$ at which the diagnostic signal d has the second diagnostic signal level $H_d$. Furthermore, it is often advantageous to perform a measurement in the edges of the internal safety signals $s_{int,1}$, $s_{int,2}$. This can be achieved by at least one measurement point in time $T_m$ at which the pulse-wise interrupted supply quantities $V_1$, $V_2$ are measured being placed within a rising or falling edge of the diagnostic signal d, wherein a transition of the diagnostic signal d from the first diagnostic signal level $L_d$ to the second diagnostic signal level $H_d$ takes place in the rising edge of the diagnostic signal d and a transition of the diagnostic signal d from the second diagnostic signal level $H_d$ to the first diagnostic signal level $L_d$ takes place in the falling edge of the diagnostic signal d.

As already stated, in the case of an analog measurement of the supply quantities $V_1$, $V_2$ to be measured, no considerations regarding measurement points in time $T_m$ to be selected are necessary. Since, in the case of an analog measurement, the measurement does not take place at selected discrete sampling points in time but continuously, the points in time at which changes in the supply quantities occur or are to be expected are also automatically detected in the case of an analog measurement. For this reason, an analog measurement may in many cases prove to be advantageous in the context of the present invention.

The mentioned measurement quantities $V_{m1}$ and $V_{m2}$ are compared to one another in a further step, wherein a malfunction in one of the channels $K_1$, $K_2$ can subsequently be deduced from a deviation of the measurement quantities $V_{m1}$ and $V_{m2}$. The comparison according to the invention of the measurement quantities $V_{m1}$ and $V_{m2}$ can take place, for example, on the basis of a difference formation or on the basis of a division. In order to evaluate the deviation between measurement quantities, such as $V_{m1}$ and $V_{m2}$, a deviation threshold can be specified in an advantageous manner. Such a deviation threshold can be specified, for example, in the form of an absolute value. In the case of an electrical voltage, the absolute value may, for example, be 10 V, or preferably 1 V, or likewise preferably 0.1 V, which the difference or the quotient of the measurement signals $V_{m1}$ and $V_{m2}$ or the absolute value of the difference or of the quotient of the measurement signals $V_{m1}$ and $V_{m2}$ must not exceed. In the case of supply quantities $V_1$, $V_2$ present as electrical currents, 10 A, or preferably 1 A, or likewise preferably 0.1 A may also be used for the absolute value. It is likewise conceivable to specify, as a deviation threshold, a relative value which, for example, describes a percentage of one of the measurement quantities $V_{m1}$ and $V_{m2}$, which percentage must not be exceeded by the deviation thereof. Preferably, 10%, or 1%, or 0.1% may be used for such a relative value.

In a preferred embodiment of the present invention, when generating the internal safety signals $s_{int,1}$ and $s_{int,2}$, it is also ensured that the deviation thereof from one another, which may also be determined on the basis of a difference formation or on the basis of a division, is also always as small as possible or at least below a specified deviation threshold. For this purpose too, a deviation threshold may be specified, for example in the form of an absolute value. In the case of safety signals $s_{int,1}$ and $s_{int,2}$ in the form of electrical voltages, this absolute value may be specified, for example, as 10 V, or preferably as 1 V, or likewise preferably as 0.1 V. However, in the case of electrical currents, 10 A, or preferably 1 A, or likewise preferably 0.1 A may in turn be used. Here too, it is likewise conceivable to specify, as a deviation threshold, a relative value which, for example, describes a percentage of one of the internal safety signals $s_{int,1}$ and $s_{int,2}$, which percentage must not be exceeded by the deviation thereof. Preferably, 10%, or 1%, or 0.1% may be used for this relative value.

In the embodiment shown in FIG. 2, the described comparison between the measurement quantities $V_{m1}$ and $V_{m2}$ takes place in the diagnostic unit (diagnoser) 111. Possible implementations of such digital diagnostic units 111 are, inter alia, provided by microprocessor-based hardware, microcontrollers and integrated circuits (ASIC, FPGA).

If the measurement takes place in an analog manner, the comparison according to the invention may, for example, be performed by a diagnostic unit 111 in the form of a comparator sufficiently known from electronic circuit technology.

The comparison according to the invention of the measurement quantities $V_{m1}$ and $V_{m2}$ is used to detect differences in the supply channels $K_1$, $K_2$, which differences manifest in the form of measurement quantities $V_{m1}$, $V_{m2}$ which deviate from one another. From an identified deviation between the measurement quantities $V_{m1}$ and $V_{m2}$, faults, in particular in the voltage interrupters $S_1$, $S_2$ themselves, in the connection thereof to the electrical source which provides the supply voltage $V_{cc}$, or at another location in the channels $K_1$, $K_2$, can be deduced. Such a comparison should always be designed in such a way that minor/negligible differences between the compared measurement quantities $V_{m1}$, $V_{m2}$, which differences may inter alia arise due to component tolerances or measurement noise, are tolerated. However, in the event of limits in one of the two channels $K_1$, $K_2$, the resulting differences should at the same time be detectable as such and a corresponding response should be triggered. The corresponding response here is in particular the bringing about of a de-energized state at the outputs $A_1$, $A_2$ of the channels $K_1$, $K_2$. At this point, however, the safety specialist entrusted with a specific situation knows how such comparisons, which are in part highly dependent on the individual case, are to be designed.

As explained, the measurement quantities $V_{m1}$ and $V_{m2}$ are compared to one another, for example on the basis of a difference formation or on the basis of a division, in order to detect malfunctions in the channels $K_1$, $K_2$, for example in the voltage interrupters $S_1$, $S_2$ themselves, in the connection thereof to the supply voltage $V_{cc}$ or at another location in the channels $K_1$, $K_2$. If a malfunction is detected, the voltage interrupters $S_1$, $S_2$ may, for example, be opened as a protective and/or safety measure, and the switching arrangement 100 may be put into a safe state. A safe state can be understood to mean a state of the switching arrangement 100 in which the protective goals defined according to a safety concept are implemented and danger to humans and/or the environment is accordingly not imminent. This is in particular achieved by de-energizing the outputs $A_1$, $A_2$ of the channels $K_1$, $K_2$.

A possible implementation of this procedure is shown in FIG. 2, where the diagnostic unit outputs the switch-off signal $X_V$. In the exemplary implementation variant of the present invention shown in FIG. 2, the switch-off signal $X_V$ is connected to the voltage interrupters $S_1$, $S_2$ and a low level for opening the voltage interrupters $S_1$, $S_2$ is assigned to the switch-off signal $X_V$ if a comparison of the measurement quantities $V_{m1}$ and $V_{m2}$ results in a deviation and thus a previously mentioned fault in one of the channels $K_1$, $K_2$. In the event of a fault, other measures for troubleshooting may however in principle also be used in an often advantageous manner, as long as it is ensured that the outputs $A_1$, $A_2$ of the given channels $K_1$, $K_2$ are thereby de-energized.

Figure 3:
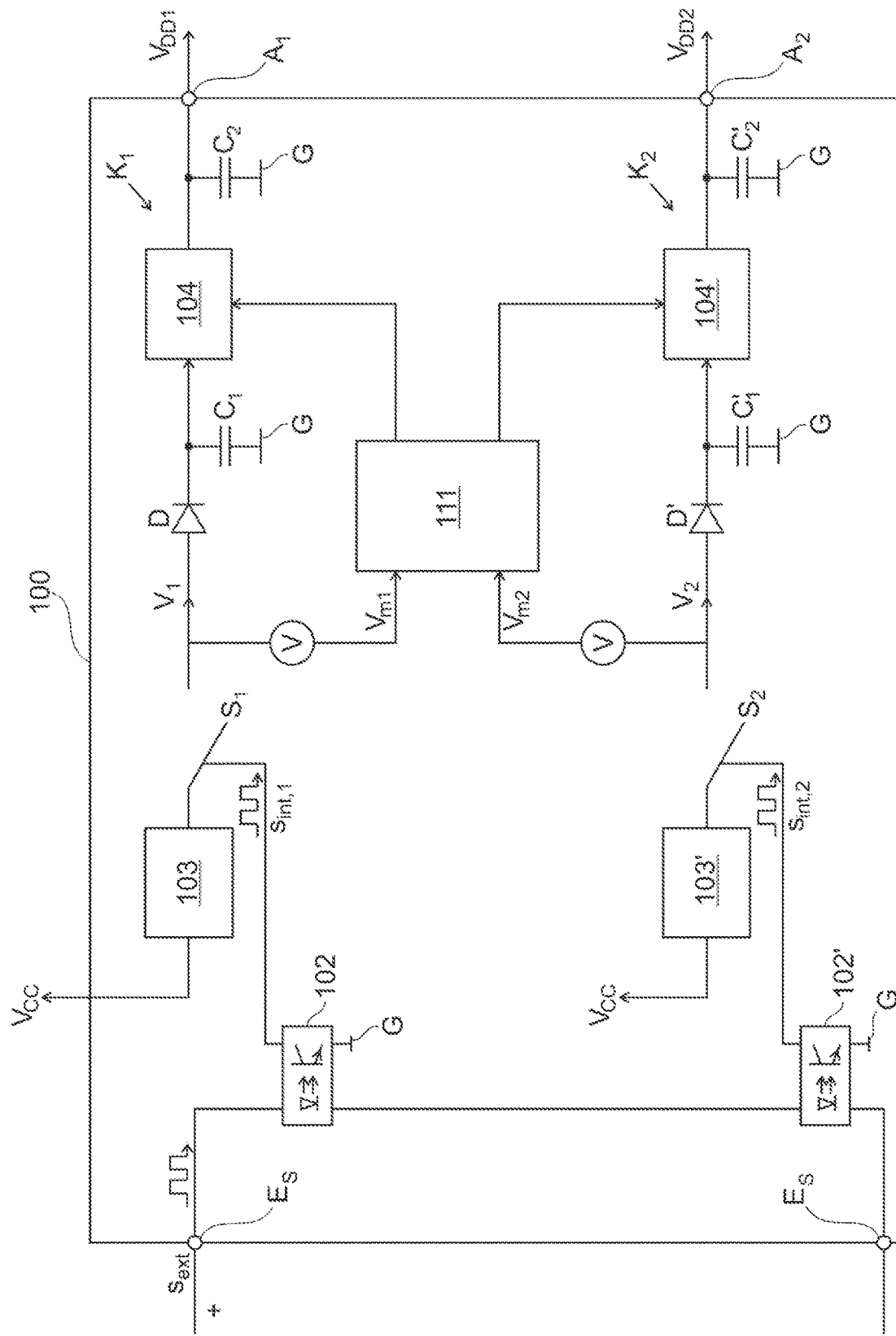
FIG. 3 shows an advantageous embodiment of a switching arrangement according to the invention.

FIG. 3 shows a possible embodiment of the switching arrangement according to the invention in a higher degree of detail. In this case, the switching arrangement 100 shown in FIG. 3 comprises a differential input with galvanically separated transformers, specifically in the form of optocouplers 102, 102', which accomplish the generation of the internal safety signals $s_{int,1}$, $s_{int,2}$ from the external safety signal $s_{ext}$. The reference potential of the illustrated circuit is referred to herein as G ("ground").

In contrast to the embodiment of FIG. 2, FIG. 3 additionally shows the blocks 103, 103', which are representative of suitable electric devices for connecting the channels $K_1$, $K_2$ to the supply voltage $V_{cc}$. Furthermore, in contrast to FIG. 2, the diodes D, D' are provided in order to prevent a possibly detrimental current reversal in the event of a fault. The capacitors $C_1$, $C_2$, $C_1'$, $C_2'$ as well as the blocks 104, 104' are used as filter elements in particular for smoothing/preparing/conditioning the generated driver supply voltages $V_{DD1}$, $V_{DD2}$. These components are discussed separately below. In the embodiment shown in FIG. 3 too, a pulsed external diagnostic signal d and a safety signal, such as an STO signal, are already linked to one another outside the switching arrangement 100 from which the external safety signal $s_{ext}$ emerges.

As mentioned, it is desired by the method according to the invention that the use of diagnostic signals d and their superposition via internal safety signals $s_{int,1}$, $s_{int,2}$ does not impair the safety functions linked to the safety signals $s_{int,1}$, $s_{int,2}$ and the normal operation of the diagnosed technical system. This requirement must be taken into account all the more if external diagnostic signals d, such as external OSSD test pulses, are not used as known from the prior art only for the testing of external safety components but are guided according to the present invention into a safe receiving element, such as the present switching arrangement 100, and there also influence power-transmitting channels $K_1$, $K_2$ for diagnostic purposes.

For this reason, FIG. 3 furthermore provides voltage buffering in the channels $K_1$, $K_2$, wherein the voltage buffering in the embodiment shown in FIG. 3 takes place on the basis of the capacitors $C_1$, $C_2$ or $C_1'$, $C_2'$. In principle, however, other types of energy stores may also be used as filter elements for this purpose, for example inductors in the form of chokes. In order to reliably avoid a subsequent undesired influence, for example, on a supplied driver module 201, 202, it is advantageous to design these energy stores such that low pulses in the supply quantities $V_1$, $V_2$, which are caused by low diagnostic pulses (portions in the diagnostic signal d with low diagnostic signal level $L_d$) having a maximum permissible time duration, are bridged. Such a maximum permissible time duration defines how long a low diagnostic pulse may be at maximum for diagnostic purposes. The aim of the aforementioned design of the filter elements is that only at low pulses in the supply quantities $V_1$, $V_2$ of which the duration exceeds this maximum duration is an effect on the output driver supply voltages $V_{DD1}$, $V_{DD2}$ apparent/permitted. In this way, an undesired influence on the driver supply voltages $V_{DD1}$, $V_{DD2}$ can be avoided without however impairing the effect of the voltage interrupters $S_1$, $S_2$ in the event of an STO fault, for example. Moreover, excessively long low pulses in the supply quantities $V_1$, $V_2$ can likewise be an indication of a fault in the switching arrangement 100, even if excessively long low diagnostic pulses occur synchronously in the channels $K_1$, $K_2$.

Another improvement in this regard is made possible in the situation shown in FIG. 3 by the blocks 104 and 104'. In a preferred embodiment, the blocks 104 and 104' may be implemented as voltage regulators which additionally readjust the voltage profiles already smoothed by the capacitances $C_1$, $C_2$ or $C_1'$, $C_2'$ and adjust the generated output voltages $V_{DD1}$ and $V_{DD2}$ to a specified setpoint value. A voltage regulator 104, 104' is in particular to be understood to mean an electrical/electronic circuit/device which is capable of correcting the output voltage, here $V_{DD1}$ and $V_{DD2}$, to a desired setpoint value. In a voltage regulator 104, 104', a measurement of the output voltage, here $V_{DD1}$ and $V_{DD2}$, can also take place, which is subsequently returned as an actual value in a control loop as is customary in control technology. In order to regulate the output voltage $V_{DD1}$, $V_{DD2}$, the voltage regulators 104, 104' may use, for example like a DC-DC converter, the periodic switching of a periodically operating electronic (semiconductor) switch. In this way, the influence of voltage interrupters $S_1$, $S_2$ opened and closed according to the pulses of a diagnostic signal d can be additionally reduced. The blocks 104, 104', but also the capacitances $C_1$, $C_2$ or $C_1'$, $C_2'$, may accordingly be understood to be filter elements that smooth the supply quantities $V_1$, $V_2$.

In the case of an implementation of the blocks 104 and 104' as voltage regulators, a further important option results for responding to a fault identified in the context of the diagnosis in one of the channels $K_1$, $K_2$. In the event of an identified malfunction, the output voltages $V_{DD1}$ and $V_{DD2}$ can thus also be brought to zero on the basis of the voltage regulators 104 and 104', and the outputs $A_1$, $A_2$ can thus be de-energized. This method for troubleshooting is particularly advantageous if a fault in one of the voltage interrupters $S_1$, $S_2$ was identified on the basis of the previously performed diagnosis. Opening the voltage interrupters $S_1$, $S_2$ would not be possible in such an event. In addition, it is however likewise conceivable to de-energize the outputs $A_1$, $A_2$ of the at least two channels $K_1$, $K_2$ by deactivating the electrical source providing the supply voltage $V_{cc}$ for supplying the channels $K_1$, $K_2$.

In contrast to the known prior art, external diagnostic signals d, such as OSSD test pulses, which are generated by a safe output device, such as a light barrier, a safety light grid, etc., are further used according to the present invention inside the switching arrangement 100. Low OSSD pulses are accordingly not filtered out at the input, as otherwise usual, but are transferred via the voltage interrupters $S_1$, $S_2$ into the two channels $K_1$, $K_2$. Up to the measuring points at which the measurement quantities $V_{m1}$, $V_{m2}$ are detected, the channels $K_1$, $K_2$ are constructed very dynamically in the sense that frequency components of the diagnostic signals d up to 100 Hz, preferably up to 1 kHz, or particularly preferably up to 10 kHz, can be detected without significant distortion on the basis of the measurement quantities $V_{m1}$, $V_{m2}$. Only after the measuring points does a filtering according to the above description take place, wherein the low pulses of the internal safety signals $s_{int,1}$, $s_{int,2}$ are in particular filtered out of the supply quantities. Up to the voltage interrupters $S_1$, $S_2$, the OSSD test pulses specified by the diagnostic signal d are however transmitted as unfiltered as possible.

Figure 4:
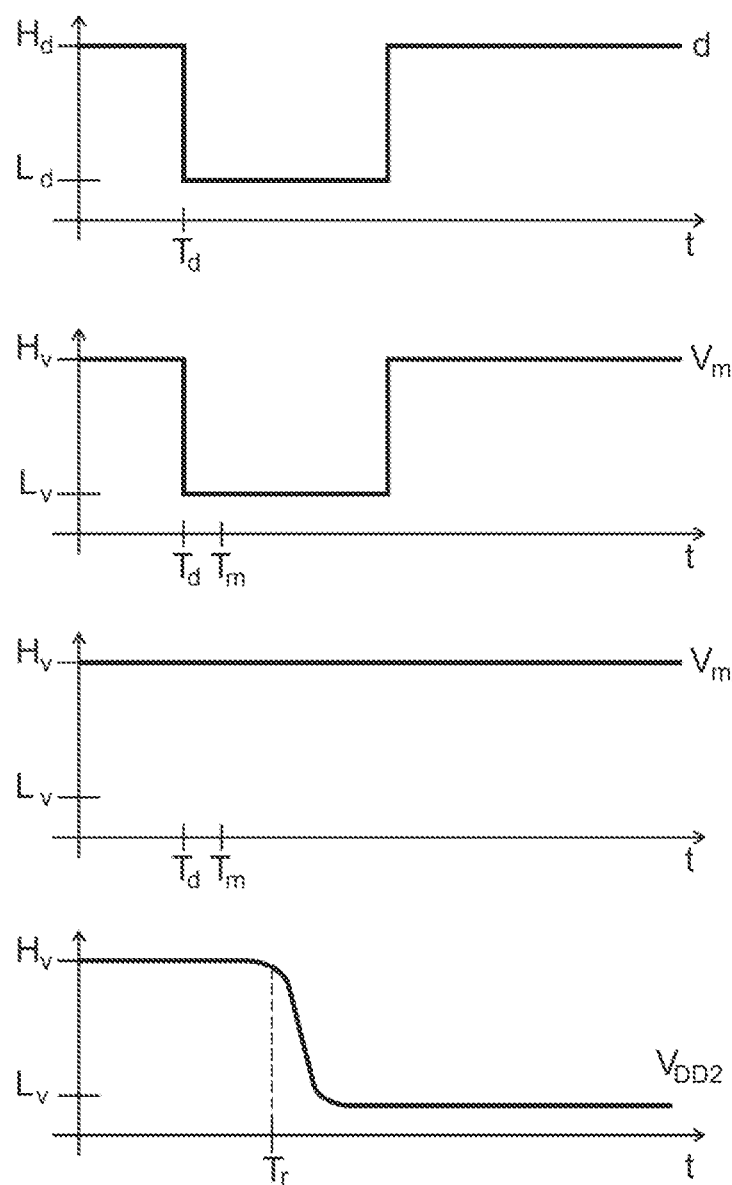
FIG. 4 shows signal profiles in the event of a fault.
Figure 5:
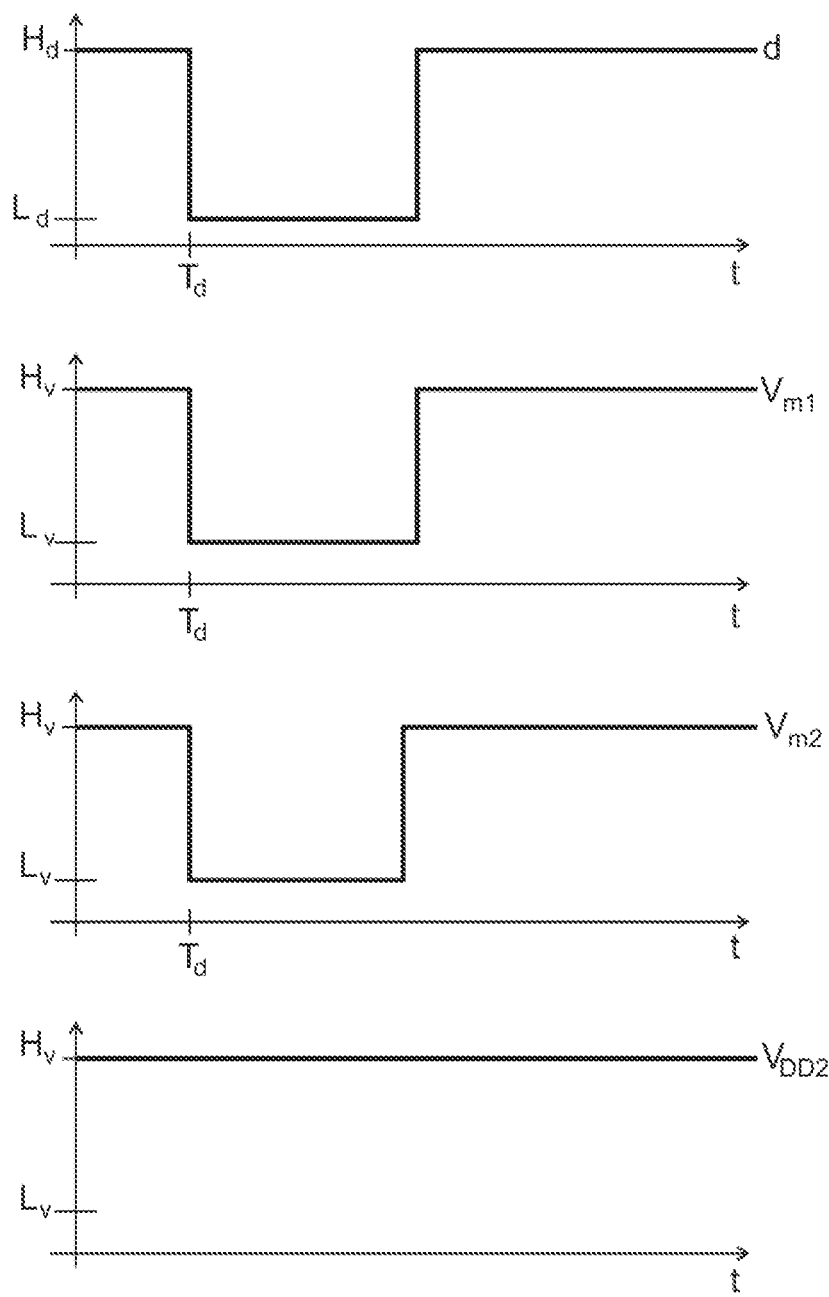
FIG. 5 shows signal profiles in normal operation.

Signal profiles that can occur in the course of the application of the method according to the invention in the circuit shown in FIG. 3 are shown in FIG. 4 and FIG. 5. The shown signals d, $V_{m1}$, $V_{m2}$ and $V_{DD2}$ in this case move within the high levels ($H_d$, $H_V$) and low levels ($L_d$, $L_V$) given for them. The respective high levels $H_d$, $H_V$ may be the same but also different depending on the application. The same applies to the low levels $L_d$, $L_V$. Specifically, FIG. 4 first shows at the diagnosis point in time $T_d$ a falling edge of the shown diagnostic signal d, which results in a likewise falling edge of the internal safety signals $s_{int,1}$, $s_{int,2}$. The shown measurement signal $V_{m1}$ also follows this profile, from which an intact first channel $K_1$ can be deduced. A defect in the supply channel $K_2$ can however be deduced from the profile of the measurement quantity $V_{m2}$ because the falling edge is not implemented in these profiles. This circumstance is also identified at the response point in time $T_r$, after which the supply is immediately interrupted, and the supply quantities $V_{DD1}$ and $V_{DD2}$ (only $V_{DD2}$ is shown) are decreased to the low level $L_V$ by a voltage regulator 104, 104'.

In contrast, FIG. 5 shows signal profiles as they result in the case of intact supply channels $K_1$, $K_2$ or in the case of a generally intact switching arrangement 1. Both measurement quantities $V_{m1}$ and $V_{m2}$ in this case follow the falling and rising edges specified by the internal safety signals $s_{int,1}$, $s_{int,2}$ due to the shown diagnostic signal d. With reference to FIG. 5, it can moreover be seen that, due to the described voltage buffering, no impairment of the generated output quantities $V_{DD1}$ and $V_{DD2}$ occurs.

The faults that can be diagnosed on the basis of the method according to the invention inter alia include faults in the supply voltage $V_{CC}$, faults at the voltage interrupters $S_1$, $S_2$, faults in the conductors of the supply channels $K_1$, $K_2$, but also faults, e.g., in the optocouplers 102, 102', which are used to generate the internal safety signals $s_{int,1}$, $s_{int,2}$. Because these faults can be detected, the diagnostic coverage can be noticeably increased. Better safety characteristic values are thus possible with the same hardware outlay.

In comparison to the known prior art, no separate additional circuit for generating test pulses is moreover required in the context of the present invention. In many cases, supply quantities in supply channels are moreover measured and monitored from the outset. Evaluation units already provided for this purpose can then also be used in a particularly advantageous manner for implementing the method according to the invention. In general, a higher diagnostic coverage can be achieved by the type of diagnosis and testing according to the invention. As a result, the ratio of achieved safety level to required hardware outlay can be improved, and expensive and complex redundant safety components can thus often be avoided.

The invention claimed is:

1. Method for monitoring an electrical switching arrangement having at least two channels, which each electrically conductively connect an electrical source supplying the respective channel, forming an electrical supply quantity, to an output of the respective channel, wherein an external safety signal is fed to the switching arrangement, from which external safety signal an internal safety signal is respectively generated for the at least two channels in order to therewith control a voltage interrupter connected in series in the respective channel, wherein the internal safety signals are superimposed with a pulsed diagnostic signal, in which a first diagnostic signal level and a second diagnostic signal level alternate, in order to form two safety signal levels which alternate in the internal safety signals, in order to open the voltage interrupters connected in the respective channels by controlling with the first safety signal level and to close them by controlling with the second safety signal level and to thus respectively alternately interrupt the supply quantities appearing in the respective channels, wherein the alternately interrupted supply quantities are measured as measurement quantities, and Wherein the detected measurement quantities of the alternately interrupted supply quantities are compared to one another in order to determine a deviation between the detected measurement quantities for monitoring the electrical switching arrangement.

2. Method according to claim 1, wherein the alternately interrupted supply quantities are each measured at at least one measurement point in time at which the diagnostic signal has the first diagnostic signal level.

3. Method according to claim 2, wherein the alternately interrupted supply quantities are each measured at at least one measurement point in time at which the diagnostic signal has the second diagnostic signal level.

4. Method according to claim 1, wherein at least one measurement point in time at which the alternately interrupted supply quantities are measured is within a rising or a falling edge of the diagnostic signal, wherein a transition of the diagnostic signal from the first diagnostic signal level to the second diagnostic signal level takes place in the rising edge of the diagnostic signal, and a transition of the diagnostic signal from the second diagnostic signal level to the first diagnostic signal level takes place in the falling edge of the diagnostic signal.

5. Method according to claim 1, wherein the outputs of the at least two channels are de-energized if the deviation of the detected measurement quantities of the supply quantities exceeds a specified deviation threshold.

6. Method according to claim 5, wherein the outputs of the at least two channels are de-energized by the voltage interrupters provided in the channels being opened.

7. Method according to claim 5, wherein the outputs of the at least two channels are de-energized by the output voltages dropping at the outputs of the channels being brought to zero by means of a voltage regulator provided for adjusting the output voltages.

8. Method according to claim 5, wherein the outputs of the at least two channels are de-energized by the electrical source for supplying the channels being deactivated.

9. Method according to claim 1, wherein the electrical supply quantities are smoothed by a filter element arranged in the channels of the electrical switching arrangement.

10. Electrical switching arrangement having at least two channels, which each electrically conductively connect an electrical source supplying the respective channel, forming an electrical supply quantity, to an output of the respective channel, having a diagnoser and an input interface, wherein the input interface is designed to accept an external safety signal, from which an internal safety signal is respectively generated for the at least two channels in order to control a voltage interrupter connected in series in the respective channel, wherein the switching arrangement is designed to superimpose the internal safety signals with a pulsed diagnostic signal, in which a first diagnostic signal level and a second diagnostic signal level alternate, to form two safety signal levels which alternate in the internal safety signals and to open the voltage interrupters connected in the respective channels by controlling with the first safety signal level and to close them by controlling with the second safety signal level in order to respectively alternately interrupt the supply quantities appearing in the respective channels, and wherein the diagnose unit is designed to measure the alternately interrupted supply quantities as measurement quantities and to compare the detected measurement quantities of the alternately interrupted supply quantities to one another in order to determine a deviation between the detected measurement quantities for monitoring the electrical switching arrangement.

* * * * *